United States Patent
Gupta Hyde et al.

(10) Patent No.: US 11,348,909 B2
(45) Date of Patent: May 31, 2022

(54) MULTI-DIE PACKAGES WITH EFFICIENT MEMORY STORAGE

(71) Applicant: Intel Corporation, Santa Clara, CA (US)

(72) Inventors: Maruti Gupta Hyde, Portland, OR (US); Nageen Himayat, Fremont, CA (US); Linda Hurd, Cool, CA (US); Min Suet Lim, Gelugor (MY); Van Le, Beaverton, OR (US); Gayathri Jeganmohan, Folsom, CA (US); Ankitha Chandran, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,445

(22) Filed: Sep. 28, 2018

(65) Prior Publication Data
US 2019/0051642 A1     Feb. 14, 2019

(51) Int. Cl.
*H01L 25/18*     (2006.01)
*H01L 23/538*    (2006.01)
(Continued)

(52) U.S. Cl.
CPC .............. *H01L 25/18* (2013.01); *G06F 1/206* (2013.01); *G06F 1/3203* (2013.01); *G06F 1/324* (2013.01); *G06F 1/3206* (2013.01); *G06F 1/3225* (2013.01); *G06F 1/3237* (2013.01); *G06F 1/3287* (2013.01); *G06F 1/3296* (2013.01); *G06N 3/0445* (2013.01); *G06N 3/063* (2013.01); *G06N 3/08* (2013.01); *H01L 23/3675* (2013.01); *H01L 23/5381* (2013.01); *H01L 23/5384* (2013.01); *H01L 25/105* (2013.01);
(Continued)

(58) Field of Classification Search
CPC ...... G06F 1/3203; G06F 1/206; G06F 1/3243; G06F 1/3275; G06N 3/063; H01L 25/0652; H01L 25/16; H01L 25/18
See application file for complete search history.

(56) References Cited

U.S. PATENT DOCUMENTS 8,519,543 B1 * 8/2013 Song .................. H01L 24/17
257/774
10,572,270 B1 * 2/2020 Sampath ............... G06F 1/1684
(Continued)

OTHER PUBLICATIONS

G. H. Loh, Y. Xie and B. Black, "Processor Design in 3D Die-Stacking Technologies," in IEEE Micro, vol. 27, No. 3, pp. 31-48, May-Jun. 2007. doi: 10.1109/MM.2007.59 (Year: 2007).*
(Continued)

*Primary Examiner* — Jaweed A Abbaszadeh
*Assistant Examiner* — Hyun Soo Kim
(74) *Attorney, Agent, or Firm* — Hanley, Flight & Zimmerman, LLC (57) ABSTRACT

Methods and apparatus to implement efficient memory storage in multi-die packages are disclosed. An example multi-die package includes a multi-die stack including a first die and a second die. The second die is stacked on the first die. The multi-die package further includes a third die adjacent the multi-die stack. The multi-die package also includes a silicon-based connector to communicatively couple the multi-die stack and the third die. The silicon-based connector includes at least one of a logic circuit or a memory circuit.

26 Claims, 7 Drawing Sheets

(51) Int. Cl.
| | |
|---|---|
| *H01L 23/367* | (2006.01) |
| *G06N 3/08* | (2006.01) |
| *G06N 3/063* | (2006.01) |
| *G06N 3/04* | (2006.01) |
| *G06F 1/3203* | (2019.01) |
| *H01L 25/10* | (2006.01) |
| *G06F 1/3296* | (2019.01) |
| *G06F 1/3237* | (2019.01) |
| *G06F 1/324* | (2019.01) |
| *H01L 25/16* | (2006.01) |
| *G06F 1/20* | (2006.01) |
| *G06F 1/3206* | (2019.01) |
| *G06F 1/3225* | (2019.01) |
| *G06F 1/3287* | (2019.01) |

(52) U.S. Cl.
CPC ............ *H01L 25/16* (2013.01); *H01L 23/367* (2013.01); *H01L 23/5383* (2013.01); *H01L 2224/16145* (2013.01); *H01L 2224/16225* (2013.01); *H01L 2224/32225* (2013.01); *H01L 2224/73204* (2013.01); *H01L 2924/15311* (2013.01)

(56) References Cited

U.S. PATENT DOCUMENTS

| | | | | |
|---|---|---|---|---|
| 2009/0267238 A1* | 10/2009 | Joseph | ................ | H01L 25/0657 257/777 |
| 2010/0078790 A1* | 4/2010 | Ito | ............................. | G11C 5/02 257/686 |
| 2012/0173895 A1* | 7/2012 | Kim | ...................... | G06F 1/3206 713/300 |
| 2013/0249276 A1 | 9/2013 | Rovik et al. | | |
| 2013/0279276 A1 | 10/2013 | Schaefer | | |
| 2015/0168972 A1* | 6/2015 | Mathiyalagan | ......... | G05F 1/625 365/226 |
| 2016/0098078 A1 | 4/2016 | Kumar et al. | | |
| 2016/0111406 A1 | 4/2016 | Mak | | |
| 2016/0239065 A1* | 8/2016 | Lee | ........................ | G06F 9/5094 |
| 2019/0041923 A1* | 2/2019 | Atsatt | .................... | G05B 15/02 |
| 2019/0050040 A1 | 2/2019 | Baskaran et al. | | |
| 2019/0103153 A1 | 4/2019 | Huang | | |
| 2019/0146566 A1* | 5/2019 | Pineda de Gyvez | . | G06F 1/3228 713/322 |
| 2019/0377341 A1 | 12/2019 | Choi | | |
| 2020/0019230 A1 | 1/2020 | Rong et al. | | |
| 2020/0035603 A1 | 1/2020 | Rubin et al. | | |

OTHER PUBLICATIONS

United States Patent and Trademark Office, "Non-Final Office Action," issued in connection with U.S. Appl. No. 16/146,463, dated Mar. 6, 2020, (74 pages).

United States Patent and Trademark Office, "Non-Final Office Action," issued in connection with U.S. Appl. No. 16/146,463, dated Sep. 18, 2020, (51 pages).

United States Patent and Trademark Office, "Final Office Action," issued in connection with U.S. Appl. No. 16/146,463, dated Feb. 23, 2021, (27 pages).

United States Patent and Trademark Office, "Non-Final Office Action," issued on connection with U.S. Appl. No. 16/146,463, dated Aug. 17, 2021, 32 pages.

United States Patent and Trademark Office, "Notice of Allowance and Fee(s) Due," issued on connection with U.S. Appl. No. 16/146,463, dated Dec. 29, 2021, 9 pages.

\* cited by examiner

MULTI-DIE PACKAGES WITH EFFICIENT MEMORY STORAGE

FIELD OF THE DISCLOSURE

This disclosure relates generally to processors, and, more particularly, to methods and apparatus to implement efficient memory storage in multi-die packages.

BACKGROUND

A limitation on the performance of processors and their associated memory is the amount of power that can be consumed without the components overheating due to insufficient thermal dissipation.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

DETAILED DESCRIPTION

There are an increasing number of applications in which relatively high-performance processors and/or processor systems are needed. As an example, autonomous vehicles require large amounts of computing power to collect and analyze data obtained from a variety of sensors and then implement appropriate maneuvers in substantially real-time to adapt to changing road conditions and/or traffic situations. For such applications to be successfully achieved, there is a need for increased memory capacity and bandwidth as well as faster processors. Improved performance may be achieved by incorporating multiple chips (e.g., a memory die, a central processing unit (CPU) die, a graphics processing unit (GPU) die, a 5G chip, etc.) into a single package or embedded system. Placing multiple dies within a single package can reduce the latency of communications between the separate dies for increased performance. The separate dies may be communicatively coupled via a substrate supporting the separate dies. In some examples, the separate dies are communicatively coupled with an embedded silicon bridge within the underlying substrate for the package. In some such examples, the silicon bridge is implemented using the embedded multi-die interconnect bridge (EMIB) technology developed by Intel Corporation to provide high speed connections between the dies. In other examples, the separate dies are support by and communicatively coupled via an interposer implemented in a separate die that is itself supported on the underlying substrate for the package. To further increase transfer rates and reduce an overall form factor for a multi-die package, the individual dies may be stacked on top of one another in vertical alignment and communicatively coupled using through silicon vias (TSVs). However, placing multiple dies in such close proximity while implementing high throughput data processing can result in significant amounts of thermal concentration that may not dissipate fast enough. Insufficient thermal dissipation can limit the thermal design power (TDP) envelope for the main processor(s) (e.g., the CPU die(s)), thereby limiting the speed at which the processor can reliably operate.

Example multi-die packages (also referred to as embedded systems) disclosed herein include at least one CPU die and at least one memory die stacked on top of each other (e.g., in vertical alignment). Additionally or alternatively, in some examples, at least one GPU die is stacked in vertical alignment with one or more CPU die and/or one or more memory die. As used herein, two dies are in vertical alignment when a first one of the dies is positioned between the second die and an underlying substrate supporting both of the dies. In some examples, multiple CPU dies and multiple memory dies are stacked on top of each other to increase the processing and memory capacity while reducing the X-Y footprint of the package. In some examples, to reduce the concern of thermal issues and/or to increase performance of such systems, one or more logic and/or memory circuits are implemented in a silicon-based connector (e.g., an embedded silicon bridge or an interposer) connecting the multi-die stack to at least one adjacent die in the embedded system. Placing logic and/or memory circuits within the silicon-based connector in this manner takes advantage of the space in the silicon-based connector beyond the basic function of interconnecting the adjacent dies. That is, by implementing logic and/or memory circuits within the silicon of the silicon-based connector, additional circuitry may be implemented in the embedded system without significantly impacting the overall size or form factor of the system, thereby increasing the capacity, capability, and/or performance of the system. Additionally or alternatively, some of the functionality that would otherwise be implemented in one or more of the dies in the multi-die stack may be implemented in the silicon-based connector, thereby reducing the power consumption of the dies within the multi-die stack. With reduced power consumption of the die stack and the greater separation between the dies and the circuits implemented in the silicon-based connector, thermal dissipation will be improved to enable improved performance of the system under certain conditions. Furthermore, in some examples, the one or more logic and/or memory circuits in the silicon-based connector include artificial intelligence (AI) architecture circuitry to manage the power usage and gating of the dies in the die stack during high workload periods to enable smart scalable power management. Greater control over power consumption based on the particular workload of the package at any given point in time can improve the efficiency of the processor and/or memory operations. Furthermore, because the AI architecture circuitry is located within the silicon-based connector, the AI architecture circuitry may also control the power management of the adjacent dies connected through the silicon-based connector, thereby enabling further improvements to the operation of the system. Further, in some examples, some or all of the AI architecture circuitry is selectively triggered in response to detecting a change in workload for the system and/or a change otherwise affecting the parameters governing power management of the system. In this manner, some or all of the AI architecture circuitry is activated only when needed to adapt power management parameters to new circumstances so that the AI architecture circuitry is not itself unnecessarily consuming power.

Figure 1:
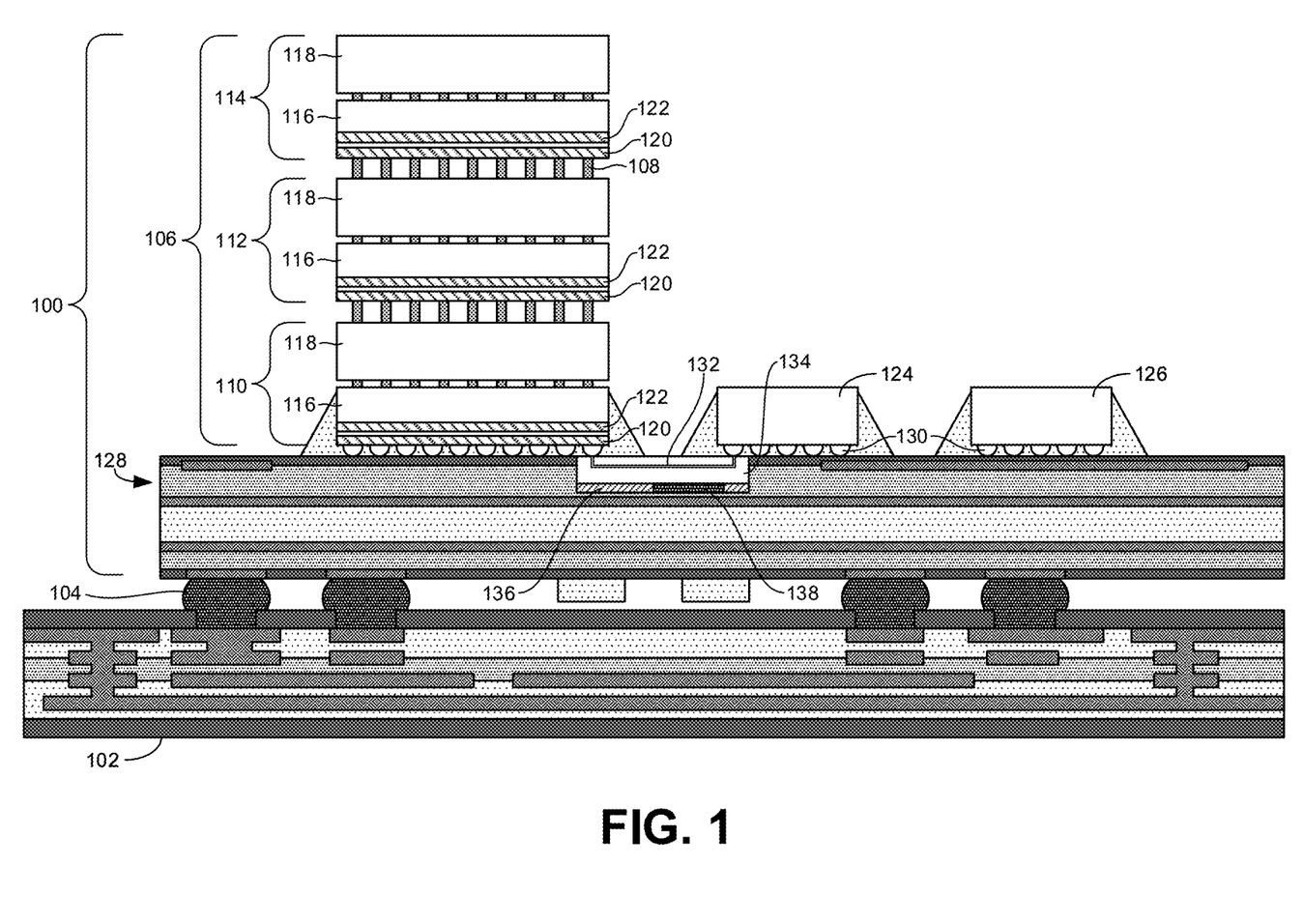
FIG. 1 is a cross-sectional view of an example multi-die package constructed in accordance with teachings of this disclosure and mounted to a printed circuit board (PCB).

FIG. 1 is a cross-sectional view of an example multi-die package 100 (alternatively referred to herein as an embedded system) constructed in accordance with teachings of this disclosure and mounted to a printed circuit board (PCB) 102 via solder balls 104. In other examples, the multi-die package 100 may be electrically connected to the PCB 102 via a ball grid array (BGA). The external housing of the example package 100 is omitted for the sake of clarity.

As shown in the example of FIG. 1, the package 100 includes a multi-die stack 106. Bonding layers between adjacent ones of the dies in the stack 106 are omitted for the sake of clarity. In some examples, the dies in the die stack 106 are communicatively interconnected using through silicon vias (TSVs) 108 (represented in the gap between the dies where a bonding layer would be). The multi-die stack 106 may include dies corresponding to any suitable type of integrated circuit (IC) chips. For purposes of discussion, in this example, the stack 106 includes multiple compute stacks 110, 112, 114 stacked on top of one another. Each compute stack 110, 112, 114 includes a CPU die 116 that provides computational (logic) functionality and a memory die 118 that provides for the storage of data. In some examples, one or more of the compute stacks 110, 112, 114 may additionally or alternatively include a GPU die.

Stacking dies in the die stack 106 as shown in FIG. 1 places the dies in closer proximity than if the dies were side-by-side. As a result, there is a reduction in the overall footprint for the package 100 relative to other embedded systems. Furthermore, the close proximity of the CPU and memory dies 116, 118 in the corresponding compute stacks 110, 112, 114, and communicatively interconnected using TSVs, reduces power loss and reduces latency for increased efficiency of the system in terms of processor speed, memory bandwidth, and/or power consumption. Further still, the close proximity of the CPU and memory dies 116, 118 increases density and, therefore, the overall capacity of the package 100 is higher relative to other packages of the same components arranged in a non-stacked manner.

In some examples, each of the compute stacks 110, 112, 114 are monolithically manufactured before the entire multi-die stack 106 is assembled. That is, in some examples, the memory die 118 is stacked onto the corresponding CPU die 116 for each respective compute stack 110, 112, 114 before the separate compute stacks 110, 112, 114 are stacked on each other. In other examples, each of the three CPU dies 116 and the three memory dies 118 are successively stacked on one another to form the die stack 106.

The multi-die stack 106 may include more or fewer dies than is shown in FIG. 1 and they may be stacked in a different order. For instance, in some examples, there may be multiple memory dies 118 associated with particular ones of the CPU dies 116. In some examples, multiple CPU dies 116 may be stacked together with multiple memory dies 118 stacked together. In some examples, the CPU die 116 for a particular compute stack 110, 112, 114 is stacked on the memory die 118 associated with the same compute stack. In some examples, the multi-die stack 106 includes only one CPU die 116 (with one or more memory dies 118).

In the illustrated example, the CPU dies 116 include multiple layers of logic circuits. In this example, the lower layer 120 (which is added first in fabrication process) is a relatively high precision layer with transistors and associated interconnects fabricated for high performance computing (HPC). The second layer 122 (which is fabricated after the lower layer 120) is a relatively low precision layer with transistors and associated interconnects fabricated for low performance computing (LPC). In some examples, some or all of the CPU dies 116 include only one of an HPC layer 120 or an LPC layer 122. In other examples, multiple HPC and/or LPC layers are present.

The memory dies 118 of the illustrated example may implement any suitable type of memory such as, for example, 3D XPoint memory, static random-access memory (SRAM), dynamic random-access memory (DRAM), flash memory, etc. Additionally or alternatively, different ones of the memory dies 118 may correspond to different types of memory.

In addition to the multi-die stack 106, the example multi-die package 100 of FIG. 1 includes additional dies 124, 126. As shown in FIG. 1, the additional dies 124, 126 are positioned spaced apart from, but adjacent to, the die stack 106 on an underlying substrate 128. The additional dies 124, 126 may be any suitable type of IC chips to provide any desired functionality for the intended application of the multi-die package 100. For example, the additional dies 124, 126 may correspond to another memory die, another CPU die, a graphics processing unit (GPU) chip, a 5G chip, an input/output (IO) controller hub (ICH) chip (e.g., a platform controller hub (PCH) chip or a fusion controller hub (FCH) chip), etc. The type of chip that is positioned closest to the die stack 106 may depend upon the intended use for the package 100. Generally speaking, the chip that benefits most from high speed transfer rates should be positioned closest to the die stack 106 so as to reduce latency between the CPU dies 116, the memory dies 118, and the adjacent die 124. Thus, if a GPU is to be implemented for general-purpose workloads (rather than merely graphics) with demand for high computation performance, the directly adjacent die 124 may be a GPU die with the second additional die 126 being an ICH die. In other situations, where large amounts of data are being transmitted over a 5G network, the directly adjacent die 124 may be a 5G chip with the second additional die 126 being an ICH die. Other combinations of dies and their relative positions are also possible. For example, although FIG. 1 illustrates dies adjacent one side of the stack 106, dies can be placed on any of the sides of the stack 106 (e.g., to the left of the die stack 106 in FIG. 1, behind the die stack 106 in FIG. 1, out of the page in front of the die stack 106 in FIG. 1, etc.). Further, although two additional dies 124, 126 are shown, there may be more or fewer additional dies integrated into the multi-die package 100. Further, in some examples, the multi-die package 100 may include more than one multi-die stack 106.

In some examples, the die stack 106 and the additional dies 124, 126 are communicatively coupled through the substrate 128 via micro-bumps 130 on the respective dies. More particularly, in the illustrated example of FIG. 1, directly adjacent ones of the dies (e.g., the die stack 106 and the first additional die 124) are communicatively coupled through interconnections 132 in a silicon-based connecter 134. In this example, the silicon-based connector 134 is an embedded silicon bridge integrated in the substrate 128 of the example package 100. The dies are connected to the bridge 134 via the micro-bumps 130 mentioned above. In some examples, the bridge 134 is implemented using the embedded multi-die interconnect bridge (EMIB) technology developed by Intel Corporation to provide high speed connections between the dies.

In some examples, the interconnections 132 built within the bridge 134 to extend between the micro-bumps 130 of different dies are located in a first portion of the silicon material of the bridge 134. Additionally, as shown in FIG. 1, a second portion of the silicon material of the bridge 134 includes one or more active components 136 such as one or more logic circuits and/or memory circuits. The active components 136 may include any suitable type of logic circuit, memory circuit, and/or other active device such as, for example, one or more transistors, a power gating circuit, a voltage regulator, a direct current (DC) converter, or static random access memory (SRAM), etc. In such examples, the active components 136 may be communicatively coupled with the die stack 106 and/or the adjacent die 124 either through the same micro-bumps 130 to which the interconnections 132 are connected or through additional micro-bumps 130 on the dies. Although the interconnections 132 are shown as being above the active components 136 in the illustrated example, other arrangements are possible. For instance, in some examples, at least some of the interconnections 132 may extend below the active components 136. In other examples, at least some of the interconnections 132 may be at or near the same depth within the bridge 134 as the active components 136 but spaced laterally apart.

As mentioned above, including the multi-die stack 106 within the multi-die package 100 of FIG. 1 increases the density of the devices within the package to increase the capability and/or reduce the footprint of the embedded system. Furthermore, placing the dies in close proximity reduces latency for increased process performance, memory bandwidth, and power consumption. While the above improvements are achieved by the package architecture illustrated in FIG. 1, stacking dies in the manner shown can create issues of overheating due to relatively large amounts of thermal concentration. Implementing active components 136 within the bridge, as described above, can mitigate against such concerns because the components 136, which may otherwise be implemented in the die stack 106, are spaced further away from the other dies, thereby allowing for better thermal dissipation without the system overheating. To further reduce the potentially deleterious effects of thermal issues, in some examples, the multi-die package 100 includes an integrated heat spreader 202 (FIG. 2) coupled to the multi-die stack 106 to assist in spreading the heat produced by the die stack 106 so as to reduce the formation of hot spots within the multi-die package 100.

Additionally or alternatively, in some examples, the active components 136 of the bridge 134 include AI architecture circuitry 138 to assist in reducing the likelihood that the system will overheat. In some examples, the AI architecture circuitry 138 may be the only active component 136 in the bridge 134. In other examples, the active components 136 may include the AI architecture circuitry and other components as described above. The AI architecture circuitry 138 is constructed to provide power management of the dies in the die stack 106 as well as the adjacent die 124. That is, the AI architecture circuitry 138 is to implement AI to adjust operational parameters associated with the CPU dies 116, the memory dies 118, and/or the first additional die 124 to control power consumption in a manner that avoids excessive thermal concentration while maintaining (e.g., optimizing) the performance and/or memory bandwidth of the system based on the current circumstances (e.g., workload) under which the system is operating. For example, the AI architecture circuitry 138 may determine when to turn on and/or turn off different ones of the CPU and/or memory dies and/or other input/output (I/O modules) to maintain high performance while establishing efficient power consumption. In some examples, the AI architecture circuitry 216 turns on and/or turns off individual sub-divisions or portions (e.g., particular circuitry) of ones of the dies (e.g., individual cores of a CPU die or sub-regions of individual cores, the HPC layer 120 versus the LPC layer 122 in the CPU dies 116, different units of memory within the memory dies 118, different circuitry within the dies, etc.).

Figure 2:
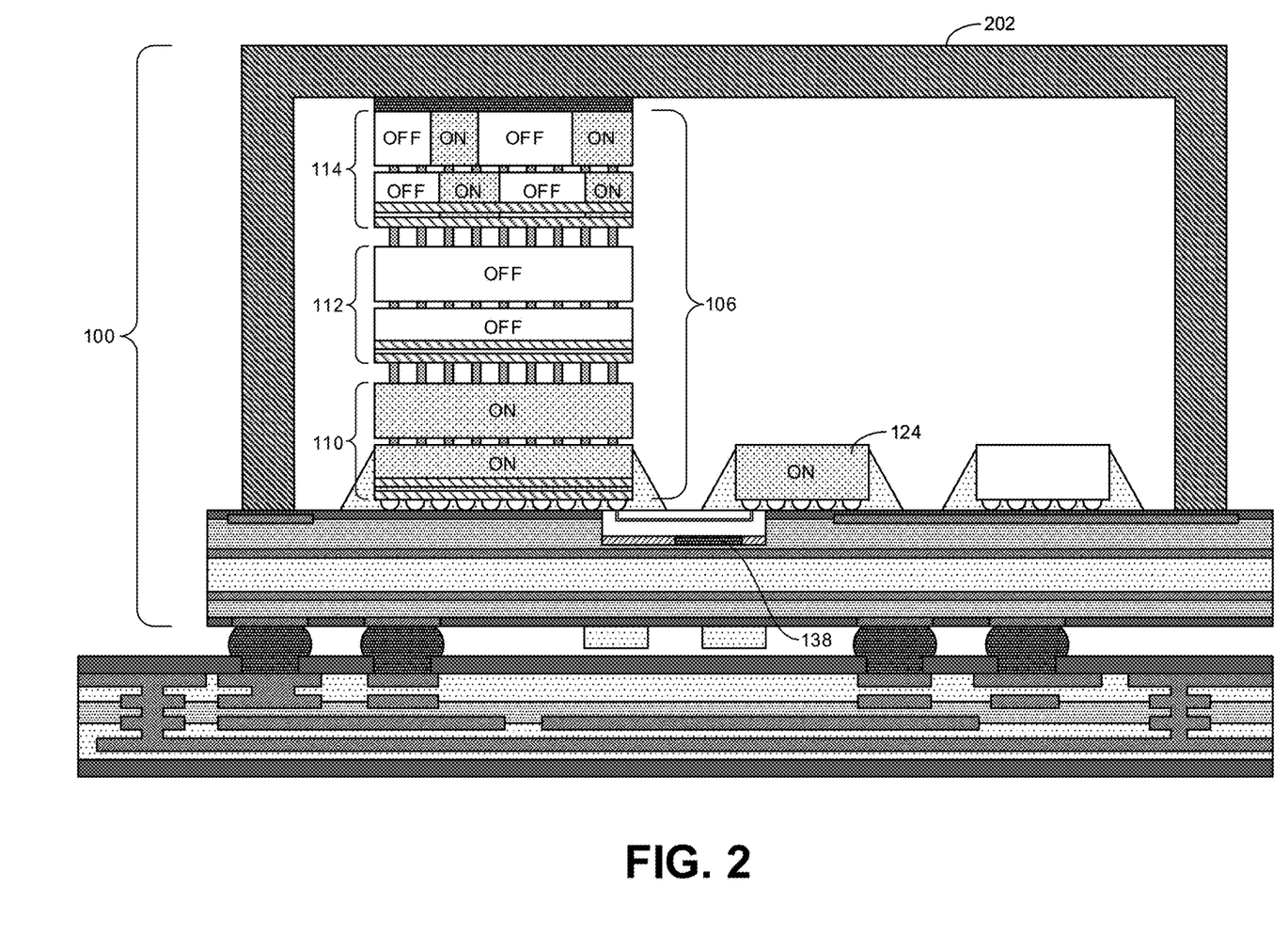
FIG. 2 is a cross-sectional view of the example multi-die package of FIG. 1 with an integrated heat spreader.

As illustrated in FIG. 2, within the multi-die stack 106, the AI architecture circuitry 138 may fully turn on (represented by the area exhibiting shading) the CPU and memory dies associated with the first compute stack 210, completely turn off (represented by the unshaded area in FIG. 2) the dies associated with the second compute stack 212, and turn on portions of the dies associated with the third compute stack 214. Further, in the illustrated example, the AI architecture circuitry 138 has fully turned on the first adjacent die 124. Aside from turning on or off the dies (or portions thereof), the AI architecture circuitry 138 may manage the power consumption of the system by adjusting other operational parameters associated with the dies. For example, the operational parameters may define one of a plurality of different power states that include intermediate states between fully on and fully off (e.g., C0, C1, C2, etc. corresponding to the Advanced Configuration Power Interface (ACPI) standard). Further, the operational parameters may correspond to a clock rate or frequency for the CPU and/or memory dies and/or particular portions thereof. Additionally or alternatively, the operational parameters may define a voltage for the CPU and/or memory dies and/or particular portions thereof. Further still, the operational parameters may define a power gating for the CPU and/or memory dies and/or particular portions thereof. The operational parameters may also define the power gating and/or shutting off of modem components (e.g., RX/TX chains) of communications circuitry (e.g., associated with a 5G chip, a 4G chip, etc.) based on the amount of information being exchanged over a network as determined by a current usage of the system and corresponding workload.

The AI architecture circuitry 138 of this example is able to intelligently manage power consumption of the die stack 106 and the adjacent die 124 by inferring the current workload of the die stack 106 and the adjacent die 124 after being trained on specific workloads in a controlled environment. That is, the AI architecture circuitry of this example is initially trained offline (e.g., at the time of manufacture)

based on controlled inputs or learning data sets corresponding to the different workloads expected to be faced by the system when placed into use. In this manner, the AI architecture circuitry 138 of this example is able to learn to identify different workloads and learn the limits of power consumption for the different dies and/or portions thereof and their associated thermal dissipation capabilities in association with corresponding ones of the workloads. Having been trained in this manner, the AI architecture circuitry 138 of this example is able to infer a current workload and then tune the operational parameters for the different dies and/or portions thereof to improve (e.g., optimize) performance under the circumstances without exceeding the power envelop for the system. Further detail regarding example implementations of the AI architecture circuitry 138 is described below in connection with FIG. 5.

Figure 3:
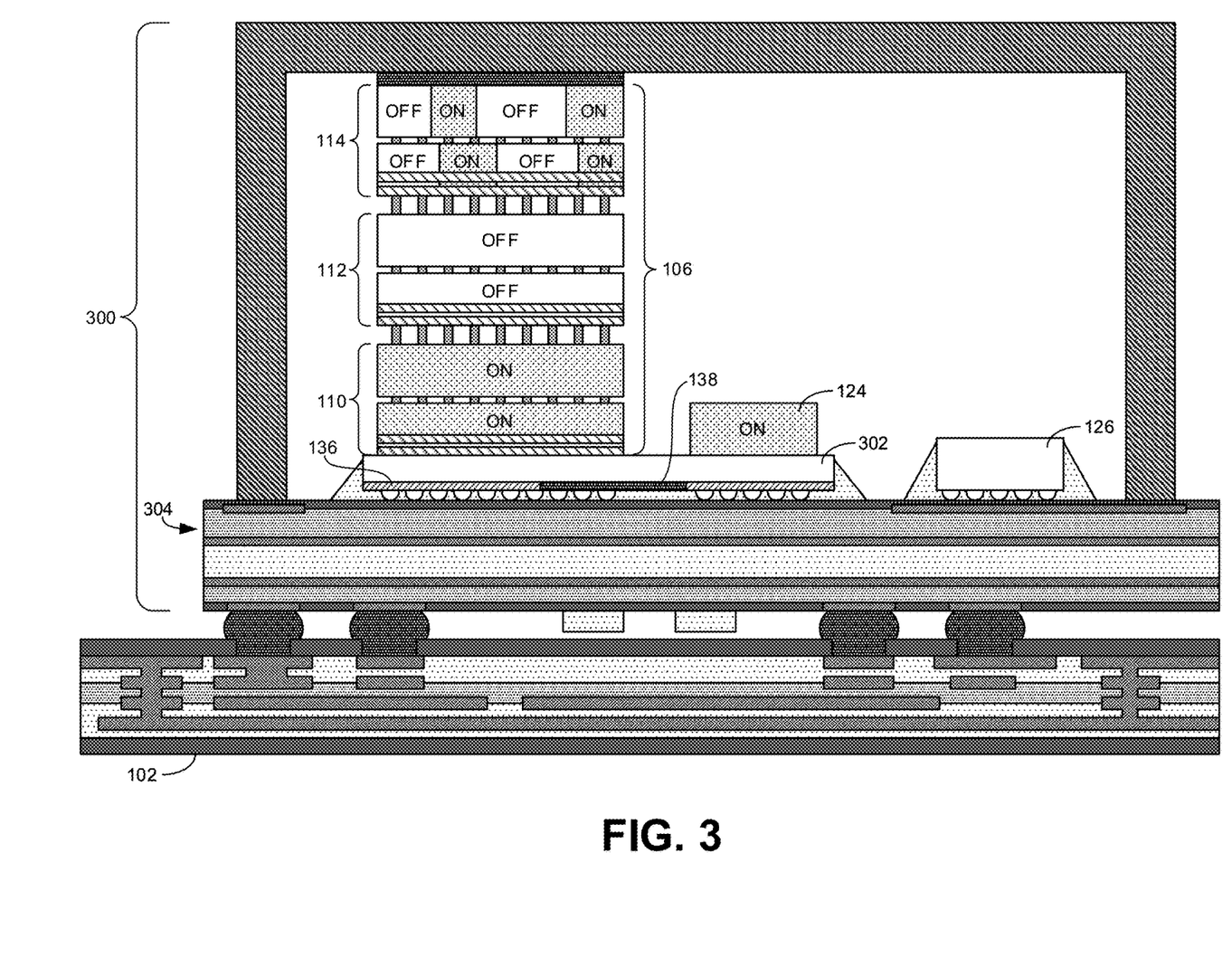
FIG. 3 is a cross-sectional view of another example multi-die package constructed in accordance with teachings of this disclosure and mounted to the PCB.

FIG. 3 illustrates another example multi-die package 300 constructed in accordance with teachings of this disclosure and mounted on the PCB 102. The multi-die package 300 of FIG. 3 includes the same multi-die stack 106 shown and described in FIGS. 1 and 2 and the same additional dies 124, 126 shown and described in FIGS. 1 and 2. Further, similar to the multi-die package 100 of FIGS. 1 and 2, the multi-die stack 106 and the first adjacent die 124 shown in FIG. 3 are communicatively coupled via a silicon-based connector 302. However, unlike the silicon-based connector 134 (e.g., the silicon bridge) of FIGS. 1 and 2, the silicon-based connector 302 of FIG. 3 corresponds to an interposer implemented in a separate die mounted on an underlying substrate 304 of the package 300. As shown in the illustrated example, the interposer 302 is large enough to enable both the die stack 106 and the adjacent die 124 to be mounted thereon side-by-side. Thus, the interposer 302 of FIG. 3 is significantly larger than the silicon bridge 134 of FIGS. 1 and 2. As a result, the interposer 302 of FIG. 3 may include significantly more active components 136 than is possible in the silicon bridge 134 of FIGS. 1 and 2. This can provide an increased capacity, capability, and/or functionality of the package 300 of FIG. 3, as compared with the package 100 of FIGS. 1 and 2. Additionally or alternatively, the greater amount of active components 136 in the interposer 302 of FIG. 3 can reduce the need for some of the circuitry that would otherwise be implemented in the multi-die stack 106. As a result, the interposer 302 of FIG. 3 can reduce the power consumption of the die stack 106, thereby reducing heat generation and, thus, thermal issues in the stack. In some examples, the active components 136 in the interposer 302 of FIG. 3 includes the AI architecture circuitry 138 to further reduce thermal issues by intelligently controlling the power consumption of the dies in the die stack 106 (as well as the adjacent die 124).

Figure 4:
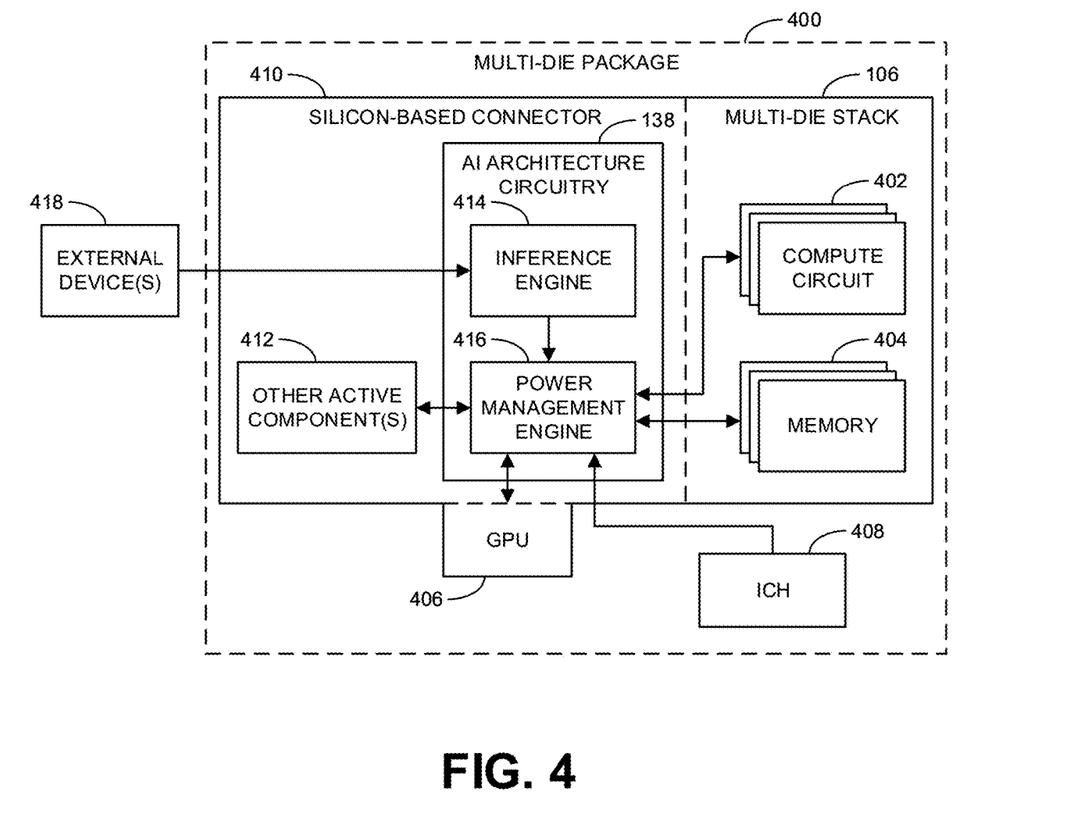
FIG. 4 is a block diagram illustrating an example implementation of the AI architecture circuitry of the example multi-die packages of FIGS. 1-3 relative to the other components of the example packages.

FIG. 4 is a block diagram of a multi-die package 400 corresponding to any of the multi-die packages 100, 300 of FIGS. 1-3 illustrating an example implementation of the AI architecture circuitry 138 relative to the other components of the package 400. As shown in the illustrated example, the multi-die package 400 includes the die stack 106 that, as described above, includes multiple CPU dies 116 and multiple memory dies 118. However, rather than representing the multi-die stack 106 based on structural components corresponding to the separate dies, in FIG. 4, the die stack 106 is represented based on its functional components (which have correspondence to different structural portions of the dies in the multi-die stack 106). In particular, as shown in FIG. 4, the multi-die stack 106 includes multiple compute circuits 402, and multiple memories 404. In this example, one or more of the compute circuits 402 in FIG. 4 are associated with ones of the CPU dies 116 identified in FIG. 1. Similarly, one or more of the memories 404 in FIG. 4 are associated with ones of the memory dies 118 identified in FIG. 1.

In the illustrated example, the multi-die package 400 includes a GPU chip 406 and an ICH chip 408, which correspond to the additional dies 124, 126 shown in FIGS. 1-3. Of course, in other examples, different types of dies may additionally or alternatively be implemented in the package 400. Additionally, as shown in FIG. 4, the package 400 includes an silicon-based connector 410 that corresponds to either the silicon bridge 134 of FIGS. 1 and 2 or the interposer 302 of FIG. 3. In the illustrated example, the silicon-based connector 410 is connected to both the multi-die stack 106 and the GPU chip 406 as represented by the dashed lines. By contrast, the ICH 408 (corresponding to the second additional die 126) is not directly connected to the silicon-based connector 410. As shown, the silicon-based connector includes the AI architecture circuitry 138. Additionally, the silicon-based connector 410 may include other active component(s) 412 of FIG. 4 is associated with at least one of the CPU dies 116 shown in FIG. 2.

In the illustrated example of FIG. 4, the AI architecture circuitry 138 includes an example inference engine 414 and an example power management engine 416. The example inference engine 414 obtains input data from one or more device(s) 418 external to the multi-die package 400. The external device(s) 418 may be any type of sensor or other input device that conveys information indicative of the circumstances of the implementation of the package components while in use. As an example, assume the multi-die package 400 is being used to control an autonomous vehicle. In such a scenario, the external devices 418 may include front and rear cameras capturing images of the surrounding environment of the vehicle, speed sensors monitoring the speed of the vehicle, accelerometers monitoring the acceleration of the vehicle, a fuel sensor monitoring the amount of fuel in the vehicle, a temperature sensor monitoring the outside temperature, a user interface interacting with occupants of the vehicle, a global positioning system (GPS) tracking the location of the vehicle, and/or any other sensors or devices that indicate the condition of the vehicle and/or the surrounding environment. Based on inputs from all of these devices, the inference engine 414 infers or classifies the workload currently being experienced by the multi-die package 400. It is expected that there may be significant variability in the intensity of the workload depending on the inputs from the external devices 418. For example, as compared with driving on an open highway, workloads may be significantly higher when a vehicle is in an urban area with constantly changing circumstances (due to changing traffic signals, turning corners, movement of other vehicles and/or pedestrians in the area, etc.) because more computational processing at relatively high speeds may be required to react to the changing circumstances in sufficient time to avoid accidents.

The ability of the inference engine 414 to classify or infer the workload at any given point in time is based on the inference engine 414 having undergone training to develop a workload learning model that enables to the engine to recognize the different possible workloads expected for the system. In the context of autonomous vehicles, such training may be implemented offline (e.g., at the time of manufacture and/or prior to assembly) using input data collected and stored offline from a vehicle being driven in different sorts of scenarios (e.g., in an urban environment with busy traffic, in a suburban environment with moderate traffic, on a highway, etc.). Once online and in operation, the inference engine 414 continues to improve or enhance its ability to classify the workload by updating the workload learning model based on what is learned from data collected when the multi-die package is used in particular applications associated with its online implementation.

Once the inference engine 414 has determined the proper classification indicative of the current workload, the determination is provided to the power management engine 416. In addition to the input received from the inference engine 414, the power management engine 416 also obtains current values corresponding to the various operational parameters of the internal components of the system including the compute circuits 402, the memories 404, the GPU chip 406, the ICH chip 408, and/or the other active component(s) 412. That is, these internal components provide the power management engine 416 with an indication of their current power states, their current operational frequencies, the kind of power gating capabilities they are equipped with, etc. In some examples, the inference engine 414 activates or triggers the power management engine 416 in response to detecting a change in workload or other circumstance associated with the system. In such examples, the power consumed by the system is reduced because the power management engine 416 only operates when needed to adapt operational parameters of the system to the new workload and/or circumstances detected by the inference engine 414.

Based on the workload (determined by the inference engine 414) and the current operational state and/or capacity of the internal components, the power management engine 416 determines an acceptable power budget that will enable the system to meet the demands of the workload without exceeding suitable thermal limits, which might interfere with system operations and/or long-term health of one or more of the system components. Further, the example power management engine 416 communicates the power states and or new values for other operational parameters calculated for each of the components within the package 400 that satisfy the power budget to maintain power consumption within a given envelope. For example, the power management engine 416 may communicate the CPU frequency for each compute circuits 402 (e.g., each CPU core), the number of computation units required, the number of GPUs required, the computation frequency, the voltage requirements, etc. The ability of the power management engine 416 to determine suitable power budgets and/or other operational parameters improves over time as the engine develops and continually updates a power management learning model based on what is learned from previous adjustments to the power budgets and/or operational parameters and the resulting impact on the workload of the components and their associated operational states. In some examples, the training by which the power management engine 416 improves its ability to control the multi-die package 200 involves a deep learning deployment toolkit that provides a unified interface to deploy networks on suitable platforms including, for example, CPUs, GPUs, and field-programmable gate arrays (FPGA). In some examples, the power management engine 416 uses a recurrent neural network (RNN) that includes long short-term memory (LSTM) units to incorporate learning based on history. Further, in some examples, the power management engine 416 includes a model optimizer that analyzes a static (e.g., current) model for operating the multi-die package 200 to determine and implement adjustments to the system that improve execution of the system. An IR file may be generated based on the adjusted model. In some examples, the IR file includes an xml file specifying the network layers and a bin file specifying the weights. In some examples, the IR file is loaded and executed on all devices with the same runtime API of the inference engine 414. That is, the inference engine 414 includes an API to load the network, prepare input and output blobs, and perform an inference on a specified target device using one or more plugins corresponding to particular types of devices.

While an example manner of implementing the AI architecture circuitry 138 of FIGS. 1-3 is illustrated in FIG. 4, one or more of the elements, processes and/or devices illustrated in FIG. 4 may be combined, divided, re-arranged, omitted, eliminated and/or implemented in any other way. Further, the example inference engine 414, the example power management engine 416, and/or, more generally, the example AI architecture circuitry 138 of FIG. 4 may be implemented by hardware, software, firmware and/or any combination of hardware, software and/or firmware. Thus, for example, any of the example inference engine 414, the example power management engine 416, and/or, more generally, the example AI architecture circuitry 138 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example inference engine 414 and/or the example power management engine 416 is/are hereby expressly defined to include a non-transitory computer readable storage device or storage disk such as a memory, a digital versatile disk (DVD), a compact disk (CD), a Blu-ray disk, etc. including the software and/or firmware. Further still, the example AI architecture circuitry 138 of FIG. 4 may include one or more elements, processes and/or devices in addition to, or instead of, those illustrated in FIG. 4, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

The example implementation of the AI architecture circuitry 138 described above is based on a centralized power management unit. That is, all computations to manage power consumption of the system are implemented by a single component (e.g., the power management engine 416). However, in some examples, power management may be implemented in a distributed manner with aspects of the computations being performed in different ones of the components of the multi-die package 400.

Figure 5:
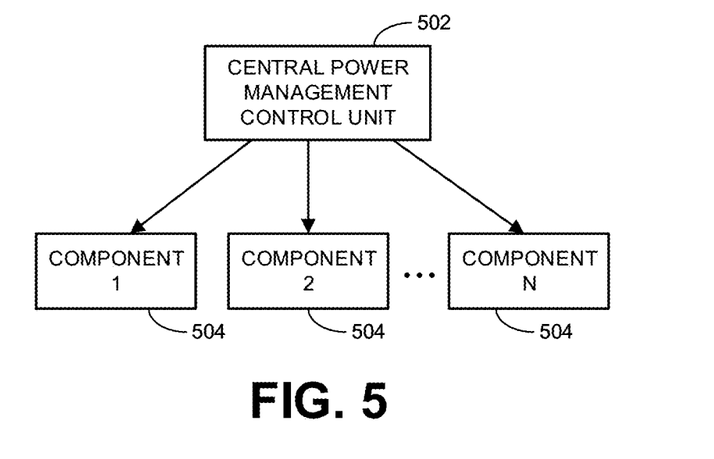
FIG. 5 is a block diagram illustrating an example implementation of a centralized power management implementation of the AI architecture circuitry of FIGS. 1-4.

The centralized power management approach is represented in the block diagram shown in FIG. 5. As shown in FIG. 5, a central power management control unit 502 (e.g., the power management engine 416) determines the power budget for the system and directly calculates and communicates the assigned values for the operational parameters (e.g., voltages, frequencies, amount of hardware to be power-gated, etc.) associated with the various components 504 in the system. The central power management control unit 502 may update the assigned values as workload conditions change. In some examples, with respect to FIG. 4, the central power management control unit 502 is implemented by the power management engine 416, with the components 504 of FIG. 5 corresponding to the compute and memory components 402, 404, the GPU chip 406, and/or the other active component(s) 412. Thus, in this example, the components 504 correspond to individual ones of the CPU and memory dies or particular portions or sub-divisions of such dies.

Figure 6:
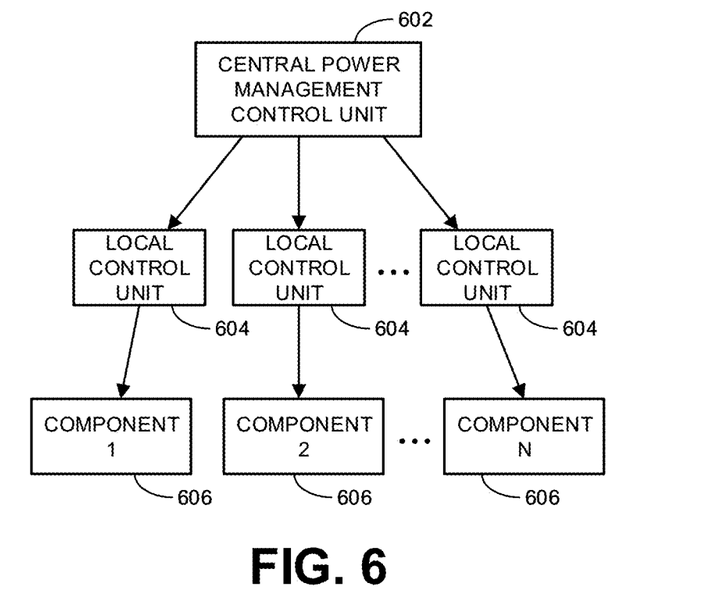
FIG. 6 is a block diagram illustrating example implementation of a distributed power management implementation of the AI architecture circuitry of FIGS. 1-4.

By contrast, a distributed power management approach is represented in the block diagram shown in FIG. 6. In the illustrated example of FIG. 6, the central power management control unit 602 determines the power budget for the system and then assigns and communicates a specific power budget to each of a plurality of a local control units 604. The central power management control unit 602 may update the designated power budget for each local control unit 604 as the workload conditions change. In the illustrated example, the local control units 604, in turn, calculate and assign appropriate values for the operational parameters associated with the various components 606 in the system based on the designated power budget provided by the central power management control unit 602. The local control units 604 may update or adjust the assigned operational parameters based on changing conditions of the workload as indicated by changes to the assigned power budget. In some examples, the local control units 604 may communicate information to the central power management control unit 602 indicative of whether a larger power budget is needed or if the associated component 606 can perform its designated function with less power. Such information serves as an additional input for the central power management control unit 602 to determine the designated power budgets for each component 606. In some examples, with respect to FIG. 4, the central power management control unit 502 is implemented by the power management engine 416, with the components 606 and corresponding local control units 604 of FIG. 6 the compute and memory components 402, 404, the GPU chip 406, and/or the other active component(s) 412. Thus, in this example, the components 606 correspond to individual ones of the CPU and memory dies or particular portions or sub-divisions of such dies. In some examples, the local control units 604 may include a local AI architecture circuitry to develop suitable values for the operational parameters over time based on a learning model. In other examples, the computations performed by the local control units 604 may be based on fixed logical operations.

In some examples, a distributed system may be implemented without the central power management control unit 602. In such examples, each local control unit 604 functions as the power management engine for the corresponding component 606 to determine both the power budget for the component (based on a current workload) and the particular values for the operational states. In such examples, the local control units 604 may communicate with one another to report the current values of the operational parameters so that they can properly determine their corresponding power budgets in light of the current operations and workload of the entire system.

Figure 7:
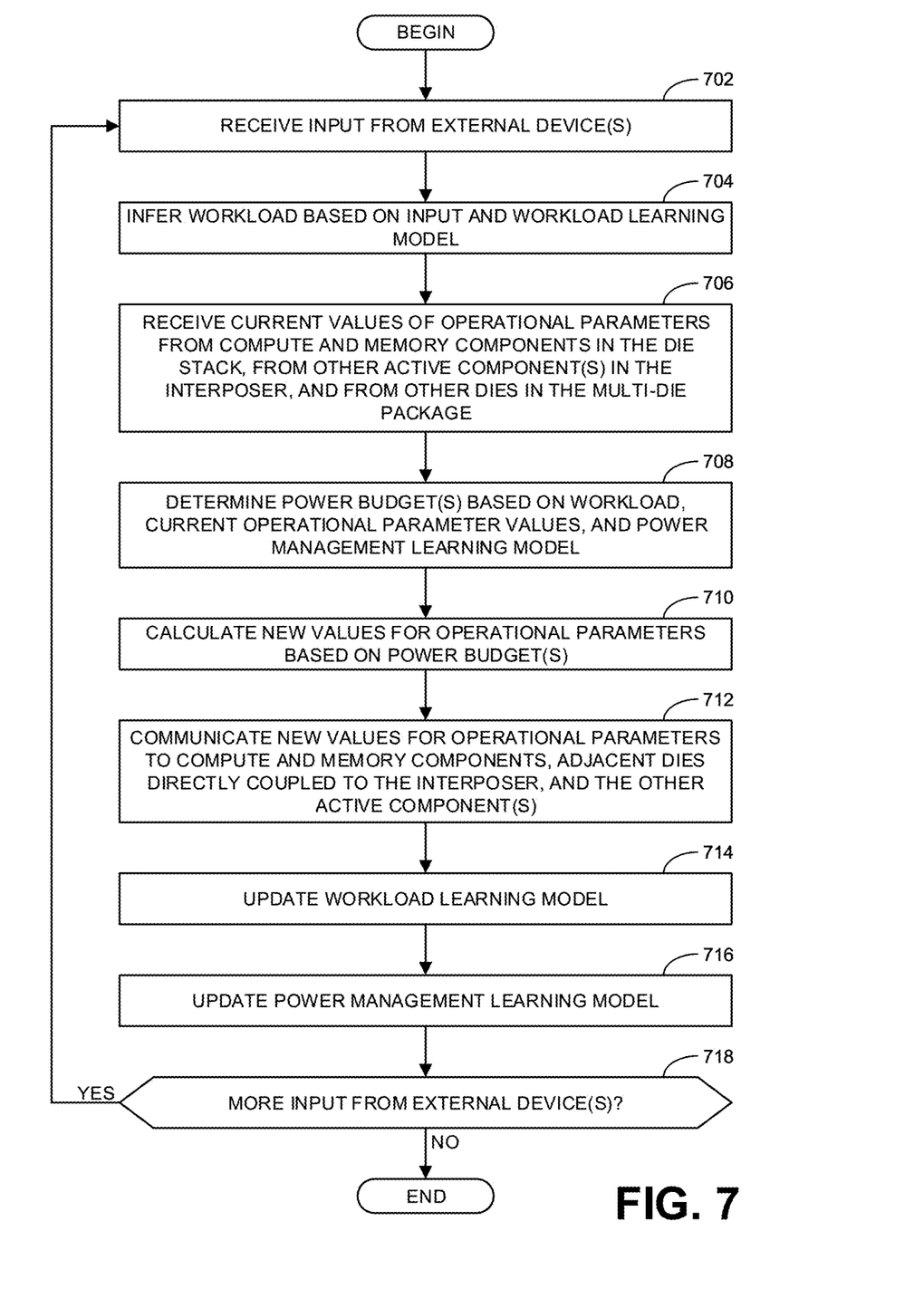
FIG. 7 is a flowchart representative of example hardware logic, machine readable instructions, hardware implemented state machines, and/or any combination thereof for implementing the AI architecture circuitry of FIG. 1-4

A flowchart representative of example hardware logic, machine readable instructions, hardware implemented state machines, and/or any combination thereof for implementing the AI architecture circuitry 138 of FIG. 1-4 is shown in FIG. 7. The machine readable instructions may be an executable program or portion of an executable program for execution by a computer processor such as the processor 812 shown in the example processor platform 800 discussed below in connection with FIG. 8. The program may be embodied in software stored on a non-transitory computer readable storage medium such as a CD-ROM, a floppy disk, a hard drive, a DVD, a Blu-ray disk, or a memory associated with the processor 812, but the entire program and/or parts thereof could alternatively be executed by a device other than the processor 812 and/or embodied in firmware or dedicated hardware. Further, although the example program is described with reference to the flowchart illustrated in FIG. 7, many other methods of implementing the example AI architecture circuitry 138 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIG. 7 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

The program of FIG. 7 begins at block 702 where the example inference engine 414 receives input from the external device(s) 418. At block 704, the example inference engine 414 infers a workload based on the input and a workload learning model. As discussed above, the inference engine 414 is able to classify or infer the workload because the inference engine 414 has already undergone training using a learning data set associated with workloads expected to be experienced by the system. This provides an initial basis for the workload learning model.

At block 706, the example power management engine 416 receives current values of operational parameters from the compute and memory components 402, 404 in the die stack 106, from the other active component(s) 412 in the silicon-based connector 410, and from other dies (e.g., the GPU chip 406 and/or the ICH chip 408) in the multi-die package 400. At block 708, the example power management engine 416 determines power budget(s) based on the workload, the current operational parameter values, and a power management learning model. In some examples, the power management engine 416 determines a single power budget for the entire system. In other examples, the power management engine 416 determines multiple power budgets designated specifically for different components within the system. At block 710, the example power management engine 416 calculates new values for the operational parameters based on the power budget(s). At block 712, the example power management engine 416 communicates the new values for the operational parameters to the compute and memory components 402, 404, the adjacent dies (e.g., the GPU chip 406) directly coupled to the silicon-based connector 410, and the other active component(s) 412.

The above description of FIG. 7 is based on a centralized approach to power management. In situations where a distributed power management system is implemented, block 710 may be omitted and block 712 is modified in that the example power management engine 416 communicates the power budgets determined for separate components in the system to corresponding local control units. In such examples, the local control units calculate the particular values for the operational parameters based on the designated power budgets.

Returning to FIG. 7, at block 714, the example inference engine 414 updates the workload learning model. At block 716, the example power management engine 416 updates the power management learning model. At block 718, the example inference engine 414 determines whether there is more input from the external device(s) 418. If so, control returns to block 702. Otherwise the example process of FIG. 7 ends.

Figure 8:
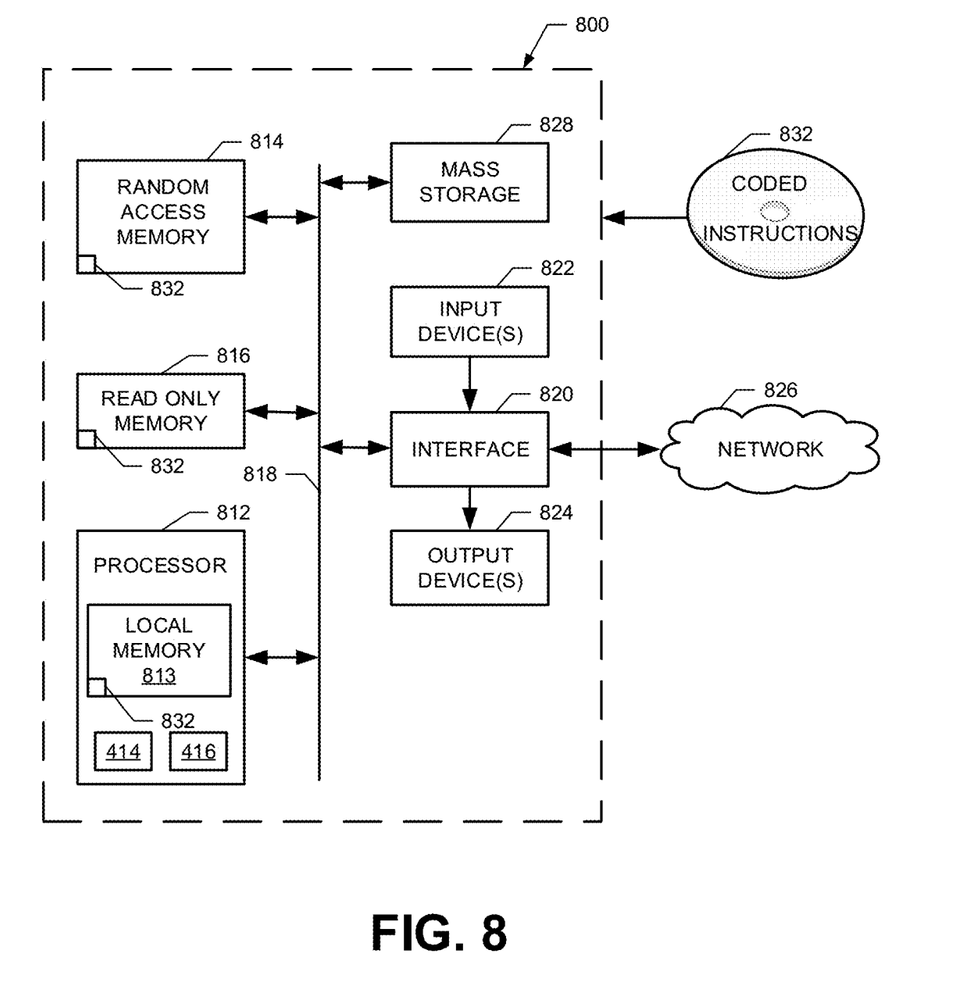
FIG. 8 is a block diagram of an example processor platform structured to execute the instructions of FIG. 7 to implement the AI architecture circuitry of FIGS. 1-4.

FIG. 8 is a block diagram of an example processor platform 800 structured to execute the instructions of FIG. 7 to implement the AI architecture circuitry 138 of FIGS. 1-4. The processor platform 800 can be, for example, a server, a personal computer, a workstation, a self-learning machine (e.g., a neural network), a mobile device (e.g., a cell phone, a smart phone, a tablet such as an iPad™), or any other type of computing device.

The processor platform 800 of the illustrated example includes a processor 812. The processor 812 of the illustrated example is hardware. For example, the processor 812 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the inference engine 414 and the power management engine 416.

The processor 812 of the illustrated example includes a local memory 813 (e.g., a cache). The processor 812 of the illustrated example is in communication with a main memory including a volatile memory 814 and a non-volatile memory 816 via a bus 818. The volatile memory 814 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), a Bluetooth® interface, a near field communication (NFC) interface, and/or a PCI express interface.

In the illustrated example, one or more input devices 822 are connected to the interface circuit 820. The input device(s) 822 permit(s) a user to enter data and/or commands into the processor 812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 820 of the illustrated example, thus, typically includes a graphics driver card, a graphics driver chip and/or a graphics driver processor.

The interface circuit 820 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 826. The communication can be via, for example, an Ethernet connection, a digital subscriber line (DSL) connection, a telephone line connection, a coaxial cable system, a satellite system, a line-of-site wireless system, a cellular telephone system, etc.

The processor platform 800 of the illustrated example also includes one or more mass storage devices 828 for storing software and/or data. Examples of such mass storage devices 828 include floppy disk drives, hard drive disks, compact disk drives, Blu-ray disk drives, redundant array of independent disks (RAID) systems, and digital versatile disk (DVD) drives.

The machine executable instructions 832 of FIG. 7 may be stored in the mass storage device 828, in the volatile memory 814, in the non-volatile memory 816, and/or on a removable non-transitory computer readable storage medium such as a CD or DVD.

From the foregoing, it will be appreciated that example methods, apparatus and articles of manufacture have been disclosed that reduce form factors of multi-die packages relative to other packages and/or increase density relative to other packages of the same size. This is made possible by stacking CPU and memory dies on top of one another. Such dies are interconnected using TSVs, which, in conjunction with the close proximity of the dies, reduces power losses and latency for increased efficiency in terms of processor speed, memory bandwidth, and/or power consumption. Densely stacked dies in this manner can produce significant thermal concentration when the dies are performing significant computational work. Accordingly, examples disclosed herein, include a silicon-based connector (e.g., a silicon bridge and/or an interposer) interconnecting the multi-die stack with other adjacent dies, where the silicon-based connector includes one or more active components to reduce the number of components (and/or the associated power consumption and/or heat generation) in the die stack, thereby reducing the impact of thermal concentration. Further, in some example, the one or more active components in the silicon-based connector include AI architecture circuitry to intelligently manage power consumption of the dies in the die stack (as well as other adjacent dies) while improving (e.g., optimizing) the performance of the system in light of a current workload inferred for the system. Disclosed methods, apparatus and articles of manufacture are accordingly directed to one or more improvement(s) in the functioning of a computer.

Example 1 includes a multi-die package, comprising a multi-die stack including a first die and a second die, the second die stacked on the first die, a third die adjacent the multi-die stack, and a silicon-based connector to communicatively couple the multi-die stack and the third die, the silicon-based connector including at least one of a logic circuit or a memory circuit.

Example 2 includes the multi-die package as defined in example 1, further including a substrate, the silicon-based connector in the substrate as a silicon bridge, the substrate to support the multi-die stack and the third die.

Example 3 includes the multi-die package as defined in any one of examples 1 or 2, further including a substrate, the silicon-based connector being an interposer implemented in a fourth die mounted on the substrate, the fourth die to support the multi-die stack and the third die.

Example 4 includes the multi-die package as defined in any one of examples 1-3, wherein the at least one of the logic circuit or the memory circuit includes at least one of a transistor, a power gating circuit, a voltage regulator, a direct current (DC) converter, or static random access memory (SRAM).

Example 5 includes the multi-die package as defined in any one of examples 1-4, wherein the at least one of the logic circuit or the memory circuit implements an artificial intelligence (AI) architecture circuitry, the AI architecture circuitry to manage power consumption of at least one of the first die, the second die, or the third die.

Example 6 includes the multi-die package as defined in example 5, wherein the AI architecture circuitry is to manage the power consumption by adjusting operational parameters associated with the at least one of the first die, the second die, or the third die, the operational parameters associated with at least one of a power state, a voltage, a frequency, or a power gating.

Example 7 includes the multi-die package as defined in example 6, wherein the AI architecture circuitry is to assign different values to operational parameters corresponding to different portions of the at least one of the first die, the second die, or the third die.

Example 8 includes the multi-die package as defined in any one of examples 6 or 7, wherein the AI architecture circuitry is to infer a workload for the at least one of the first die, the second die, or the third die, the AI architecture circuitry to adjust the operational parameters based on the inferred workload.

Example 9 includes the multi-die package as defined in any one of examples 1-8, wherein the multi-die stack includes through silicon vias to communicatively couple the first die and the second die.

Example 10 includes the multi-die package as defined in any one of examples 1-9, wherein the first die corresponds to a CPU die, and the second die corresponds to a memory die.

Example 11 includes the multi-die package as defined in example 10, wherein the CPU die includes a first layer of first logic circuits and a second layer of second logic circuits, the second layer being above the first layer, the first logic circuits being higher performance than the second logic circuits.

Example 12 includes the multi-die package as defined in any one of examples 10 or 11, wherein the memory die includes at least one of 3D XPoint® memory, static random-access memory (SRAM), dynamic random-access memory (DRAM), or flash memory.

Example 13 includes the multi-die package as defined in any one of examples 10-12, wherein the multi-die stack includes a fourth die stacked on the second die and a fifth die stacked on the fourth die, the fourth die corresponding to a second CPU die, the fifth die corresponding to a second memory die.

Example 14 includes a multi-die package, comprising a silicon-based connector including an active component, a first die on the silicon-based connector, a second die adjacent the first die, the first die communicatively coupled with the second die via the silicon-based connector, and a third die stacked on the first die.

Example 15 includes the multi-die package as defined in example 14, further including a substrate having the silicon-based connector integrated therein, the first and second dies mounted on the substrate above the silicon-based connector relative to a printed circuit board.

Example 16 includes the multi-die package as defined in any one of examples 14 or 15, further including a substrate, and a fourth die mounted on the substrate, the first and second dies mounted on the fourth die, the fourth die including the silicon-based connector.

Example 17 includes the multi-die package as defined in any one of examples 14-16, wherein the active component is associated with at least one of a logic circuit or a memory circuit.

Example 18 includes the multi-die package as defined in any one of examples 14-17, wherein the active component corresponds to an artificial intelligence (AI) architecture circuitry, the AI architecture circuitry to manage power consumption of at least one of the first die, the second die, or the third die.

Example 19 includes the multi-die package as defined in example 18, wherein the silicon-based connector includes additional active components, the additional active components including at least one of a transistor, a power gating circuit, a voltage regulator, a direct current (DC) converter, or static random access memory (SRAM).

Example 20 includes the multi-die package as defined in any one of examples 18 or 19, wherein the AI architecture circuitry includes an inference engine to infer a workload for at least one of the first die, the second die, or the third die, the workload inferred based on input from a device external to the multi-die package, and a power management engine to determine assigned values for operational parameters associated with at least one of the first die, the second die, or the third die, the assigned values determined based on the inferred workload and on current values for the operational parameters.

Example 21 includes the multi-die package as defined in example 20, wherein the operational parameters correspond to at least one of a power state, a voltage, a frequency, or a power gating.

Example 22 includes the multi-die package as defined in any one of examples 20 or 21, wherein the AI architecture circuitry is to assign different values for operational parameters corresponding to different portions of the at least one of the first die, the second die, or the third die.

Example 23 includes the multi-die package as defined in any one of examples 20-22, wherein the inference engine is to activate the power management engine in response to detecting a change in the workload.

Example 24 includes the multi-die package as defined in any one of examples 14-23, wherein the first and third dies are communicatively coupled by through silicon vias.

Example 25 includes the multi-die package as defined in any one of examples 14-24, wherein the first die corresponds to a CPU die, and the third die corresponds to a memory die.

Example 26 includes the multi-die package as defined in example 25, wherein the CPU die includes a first layer of first logic circuits and a second layer of second logic circuits, the second layer being above the first layer, the first logic circuits being higher performance than the second logic circuits.

Example 27 includes the multi-die package as defined in any one of examples 25 or 26, wherein the memory die includes at least one of 3D XPoint® memory, static random-access memory (SRAM), dynamic random-access memory (DRAM), or flash memory.

Example 28 includes the multi-die package as defined in any one of examples 25-27, further including a fourth die stacked on the third die, and a fifth die stacked on the fourth die, the fourth die corresponding to a second CPU die, the fifth die corresponding to a second memory die.

Example 29 includes a method to manage power consumption of dies in a multi-die package, the method comprising inferring, with artificial intelligence (AI) architecture circuitry in a silicon-based connector communicatively coupling different ones of the dies, a workload for the dies based on input from a device external to the multi-die package, the dies including a CPU die, a memory die stacked in vertical alignment with the CPU die, and a separate die spaced apart from and adjacent the CPU die, and assigning new values for operational parameters associated with the dies, the new values based on the inferred workload and based on current values for the operational parameters obtained from the dies.

Example 30 includes the method as defined in example 29, further including determining, with the AI architecture circuitry, a power budget for the dies based on the inferred workload and based on the current values, and calculating the new values based on the power budget.

Example 31 includes the method as defined in example 30, further including determining separate power budgets for separate portions of ones of the dies.

Example 32 includes the method as defined in example 31, further including communicating the separate power budgets to local control units associated with the separate portions, the local control units to implement the calculating and the assigning of the new values for the operational parameters.

Example 33 includes the method as defined in example 29, wherein the operational parameters correspond to at least one of a power state, a voltage, a frequency, or a power gating associated with respective ones of the dies or individual portions of ones of the dies.

Example 34 includes a non-transitory computer readable medium comprising instructions that, when executed, causes a machine to at least perform the methods of any one of examples 29-33.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A multi-die package, comprising:
a multi-die stack including a first die and a second die, the second die stacked on the first die;
a third die adjacent the multi-die stack; and
a silicon-based connector distinct from the first, second, and third dies, the silicon-based connector to communicatively couple the multi-die stack and the third die, the silicon-based connector including at least one of a logic circuit or a memory circuit, the at least one of the logic circuit or the memory circuit to implement artificial intelligence (AI) architecture circuitry, the AI architecture circuitry external to the first, second, and third dies, the AI architecture circuitry including first circuitry and second circuitry distinct from the first circuitry, the first circuitry to detect, based on a first machine learning model, a change in workload for at least one of the first die, the second die, or the third die, the first circuitry to activate the second circuitry in response to the detection of the change in workload, the second circuitry inactive prior to the detection of the change in workload, the second circuitry to adjust, based on a second machine learning model developed through training, an operational parameter that affects power consumption of at least one of the first die, the second die, or the third die, an output of the first machine learning model to be an input to the second machine learning model.

2. The multi-die package as defined in claim 1, further including a substrate, the silicon-based connector in the substrate as a silicon bridge, the substrate to support the multi-die stack and the third die.

3. The multi-die package as defined in claim 1, further including a substrate, the silicon-based connector being an interposer implemented in a fourth die mounted on the substrate, the fourth die to support the multi-die stack and the third die.

4. The multi-die package as defined in claim 1, wherein the at least one of the logic circuit or the memory circuit includes at least one of a transistor, a power gating circuit, a voltage regulator, a direct current (DC) converter, or static random access memory (SRAM).

5. The multi-die package as defined in claim 1, wherein the operational parameter is associated with at least one of a power state, a voltage, a frequency, or a power gating.

6. The multi-die package as defined in claim 5, wherein the AI architecture circuitry is to assign different values to different operational parameters corresponding to different portions of the at least one of the first die, the second die, or the third die.

7. The multi-die package as defined in claim 5, wherein the first circuitry is to infer the workload for the at least one of the first die, the second die, or the third die, the second circuitry to adjust the operational parameter based on the inferred workload.

8. The multi-die package as defined in claim 1, wherein the multi-die stack includes through silicon vias to communicatively couple the first die and the second die.

9. The multi-die package as defined in claim 1, wherein the first die corresponds to a CPU die, and the second die corresponds to a memory die.

10. The multi-die package as defined in claim 9, wherein the CPU die includes a first layer of first logic circuits and a second layer of second logic circuits, the second layer above the first layer, the first logic circuits being higher performance than the second logic circuits.

11. The multi-die package as defined in claim 9, wherein the memory die includes at least one of 3D XPoint® memory, static random-access memory (SRAM), dynamic random-access memory (DRAM), or flash memory.

12. The multi-die package as defined in claim 9, wherein the multi-die stack includes a fourth die stacked on the second die and a fifth die stacked on the fourth die, the fourth die corresponding to a second CPU die, the fifth die corresponding to a second memory die.

13. The multi-die package as defined in claim 1, wherein the AI architecture circuitry is to update the first machine learning model based on data collected during use of the multi-die package.

14. The multi-die package as defined in claim 1, wherein the silicon-based connector includes a surface to which the multi-die stack and the third die are physically coupled, the silicon-based connector including a physical interconnection that extends from the multi-die stack to the third die to communicatively couple the multi-die stack and the third die, the physical interconnection closer to the surface of the silicon-based connector than the at least one of the logic circuit or the memory circuit.

15. The multi-die package as defined in claim 1, wherein the second circuitry is to return to an inactive state after adjustment of the operational parameter while the first circuitry remains active.

16. The multi-die package as defined in claim 1, wherein the second circuitry is to implement the second machine learning model.

17. The multi-die package as defined in claim 1, wherein the first circuitry is to update the first machine learning model based on data collected in an online implementation associated with use of an autonomously controlled vehicle.

18. A multi-die package, comprising:
a silicon-based connector including artificial intelligence (AI) architecture circuitry;
a first die on the silicon-based connector;
a second die adjacent the first die, the first die communicatively coupled with the second die via the silicon-based connector; and
a third die on the first die, the silicon-based connector distinct from the first, second, and third dies, the AI architecture circuitry including first circuitry and second circuitry distinct from the first circuitry, the first circuitry to detect, based on a first machine learning model, a change in workload for at least one of the first die, the second die, or the third die, the second circuitry to adjust, based on a second machine learning model, operational parameters corresponding to power consumption of at least one of the first die, the second die, or the third die, the first circuitry to activate the second circuitry from an unpowered state in response to the detection of the change in workload, an output of the first machine learning model to be an input to the second machine learning model.

19. The multi-die package as defined in claim 18, further including a substrate having the silicon-based connector integrated therein, the first and second dies mounted on the substrate above the silicon-based connector relative to a printed circuit board.

20. The multi-die package as defined in claim 18, further including:
a substrate; and
a fourth die mounted on the substrate, the first and second dies mounted on the fourth die, the fourth die including the silicon-based connector.

21. The multi-die package as defined in claim 18, wherein the silicon-based connector includes an active component associated with at least one of a logic circuit or a memory circuit.

22. The multi-die package as defined in claim 18, wherein the first circuitry is to infer the workload for at least one of the first die, the second die, or the third die based on input from a device external to the multi-die package, and the second circuitry is to determine assigned values for the operational parameters, the assigned values determined based on the inferred workload and on current values for the operational parameters.

23. A method to manage power consumption of dies in a multi-die package, the method comprising:
inferring, with artificial intelligence (AI) architecture circuitry in a silicon-based connector communicatively coupling different ones of the dies, a workload for the dies based on input from a device external to the multi-die package, the dies including a CPU die, a memory die in vertical alignment with the CPU die, and a separate die spaced apart from and adjacent the CPU die, the AI architecture circuitry including first circuitry and second circuitry distinct from the first circuitry, the first circuitry to use a first machine learning model to infer the workload;
in response to detection of a change in the workload by the first circuitry, switching the second circuitry from a first state to a second state, the second state being a higher power state than the first state; and
assigning, with the second circuitry based on a second machine learning model, new values for operational parameters associated with at least two of the dies, the new values based on the inferred workload from the first machine learning model and based on current values for the operational parameters obtained from the dies.

24. The method as defined in claim 23, further including:
determining, with the AI architecture circuitry, a power budget for the dies based on the inferred workload and based on the current values; and
calculating the new values based on the power budget.

25. The method as defined in claim 24, further including determining separate power budgets for separate portions of ones of the dies.

26. The method as defined in claim 23, wherein the workload is inferred using the first machine learning model developed through training, the method further including updating the first machine learning model based on data collected during use of the multi-die package.

* * * * *